US011962252B2

(12) United States Patent
Rince et al.

(10) Patent No.: US 11,962,252 B2
(45) Date of Patent: Apr. 16, 2024

(54) ADVANCE SUPPLY TO INSURE SAFE BEHAVIOR OF AN INVERTER APPLICATION

(71) Applicant: NXP USA, Inc., Austin, TX (US)

(72) Inventors: Jean-Christophe Patrick Rince, Roques (FR); Maxime Clairet, Labastidette (FR); Erik Santiago, La Tour du Crieu (FR); Jean-Philippe Meunier, Ayguesvives (FR); Antoine Fabien Dubois, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/469,302

(22) Filed: Sep. 8, 2021

(65) Prior Publication Data

US 2022/0131477 A1 Apr. 28, 2022

(30) Foreign Application Priority Data

Oct. 28, 2020 (EP) .................................. 20306292.2

(51) Int. Cl.
*H02M 7/537* (2006.01)
*H02M 1/08* (2006.01)
(Continued)

(52) U.S. Cl.
CPC ............. *H02M 7/537* (2013.01); *H02M 1/08* (2013.01); *H02M 1/088* (2013.01); *H02M 7/219* (2013.01);
(Continued)

(58) Field of Classification Search
CPC ........ H02M 7/537; H02M 1/08; H02M 1/088; H02M 7/219; H02M 1/0006; H02M 1/325;
(Continued)

(56) References Cited

U.S. PATENT DOCUMENTS 6,825,700 B2 * 11/2004 Hano .................. H01L 27/0629
327/108
7,274,241 B2 * 9/2007 Ho .......................... H02M 1/44
327/170
(Continued)

FOREIGN PATENT DOCUMENTS

EP 0320307 B1 5/1993
EP 2456035 A1 5/2012
(Continued)

OTHER PUBLICATIONS

Julian et al., "Operating Standby Redundant Controller to Improve Voltage-Source Inverter Reliability", IEEE Transactions on Industry Applications, Sep. 1, 2010, pp. 2008-2014, vol. 46, No. 5.
(Continued)

*Primary Examiner* — Yusef A Ahmed

(57) ABSTRACT

An apparatus to insure safe behavior in an inverter system. In one embodiment, the apparatus includes a first high side gate driver, a first low side gate driver, a microcontroller configured to control the first high side and low side gate drivers. A voltage regulator provides a supply voltage to the microcontroller. A first pair of high side voltage regulators provide a first pair of high side supply voltages to the first high side gate driver. A first pair of low side voltage regulators provide a first pair of low side supply voltages to the first low side gate driver.

17 Claims, 8 Drawing Sheets

(51) Int. Cl.
  *H02M 1/088* (2006.01)
  *H02M 7/219* (2006.01)
  *H03K 17/56* (2006.01)
(52) U.S. Cl.
  CPC ..... *H03K 17/56* (2013.01); *H03K 2217/0063* (2013.01); *H03K 2217/0072* (2013.01); *H03K 2217/0081* (2013.01)
(58) Field of Classification Search
  CPC . H02M 1/32; H03K 17/56; H03K 2217/0063; H03K 2217/0072; H03K 2217/0081; H02P 27/08; H02P 29/028
  See application file for complete search history.

(56) References Cited

U.S. PATENT DOCUMENTS

| | | | |
|---|---|---|---|
| 7,965,522 B1* | 6/2011 | Hornberger | H02M 1/08 363/21.1 |
| 8,994,411 B2* | 3/2015 | Draxelmayr | H03K 5/1515 327/108 |
| 9,136,696 B2 | 9/2015 | Panuce et al. | |
| 9,608,623 B1* | 3/2017 | Kandah | G01R 19/0084 |
| 9,673,809 B1* | 6/2017 | Kandah | H02P 27/08 |
| 9,929,652 B1* | 3/2018 | Ribarich | H02M 3/158 |
| 10,320,294 B2 | 6/2019 | Jiang et al. | |
| 10,505,370 B2 | 12/2019 | Geng et al. | |
| 10,587,262 B1* | 3/2020 | Morini | H03K 17/165 |
| 10,658,927 B1* | 5/2020 | Pelicia | H02M 3/07 |
| 10,691,153 B1* | 6/2020 | Tsai | G05F 1/561 |
| 10,720,918 B2* | 7/2020 | Satoh | H01L 29/7393 |
| 11,171,648 B2* | 11/2021 | Ikeuchi | H03K 17/302 |
| 11,177,648 B2 | 11/2021 | Li et al. | |
| 2005/0073859 A1* | 4/2005 | Fukumoto | H02M 7/53803 363/16 |
| 2006/0113838 A1* | 6/2006 | Iwagami | H02M 7/53873 307/1 |
| 2006/0132194 A1* | 6/2006 | Harriman | H02M 7/538 327/108 |
| 2007/0188219 A1* | 8/2007 | Segarra | G01R 19/32 330/2 |
| 2012/0133420 A1* | 5/2012 | Draxelmayr | H03K 17/94 327/365 |
| 2012/0195079 A1* | 8/2012 | Kroeze | H02M 7/5387 363/55 |
| 2013/0249621 A1* | 9/2013 | Gagne | H03K 17/063 327/408 |
| 2014/0300413 A1* | 10/2014 | Hoyerby | H03F 3/2171 327/109 |
| 2015/0130533 A1* | 5/2015 | Jeon | G11C 5/147 327/540 |
| 2016/0149504 A1* | 5/2016 | Quigley | H02M 3/33546 363/21.04 |
| 2018/0331616 A1* | 11/2018 | Hirakata | H03K 17/687 |
| 2018/0331626 A1* | 11/2018 | Akaho | H02M 3/1588 |
| 2018/0343009 A1* | 11/2018 | Li | H03K 17/223 |
| 2018/0345400 A1 | 12/2018 | Wang et al. | |
| 2019/0044768 A1* | 2/2019 | Kim | H04L 27/04 |
| 2019/0199086 A1 | 6/2019 | Li et al. | |
| 2019/0288592 A1* | 9/2019 | Akahane | H03K 19/017509 |
| 2019/0294480 A1* | 9/2019 | Li | H02M 3/158 |
| 2019/0341917 A1* | 11/2019 | Li | H03K 17/0828 |
| 2020/0067400 A1* | 2/2020 | Li | H02M 1/4216 |
| 2020/0076416 A1* | 3/2020 | Bang | H03K 17/08122 |
| 2020/0217870 A1* | 7/2020 | Rince | G01P 3/489 |
| 2020/0244265 A1* | 7/2020 | Paganini | H03K 19/00315 |
| 2020/0280311 A1* | 9/2020 | Morini | H02M 1/08 |
| 2020/0280313 A1* | 9/2020 | Rinne | H02M 1/08 |
| 2020/0305252 A1* | 9/2020 | Jeong | H02M 1/44 |
| 2021/0028699 A1* | 1/2021 | Yamamoto | H02M 3/158 |
| 2021/0119627 A1* | 4/2021 | Lee | H02M 7/53871 |
| 2022/0085747 A1* | 3/2022 | Iwagami | H02M 7/53871 |
| 2022/0166319 A1* | 5/2022 | Brambilla | H03K 17/162 |
| 2022/0182004 A1* | 6/2022 | Heckroth | H03K 17/145 |
| 2022/0182041 A1* | 6/2022 | Tesu | H03K 3/012 |
| 2022/0182052 A1* | 6/2022 | Heckroth | H02P 27/08 |
| 2022/0311433 A1* | 9/2022 | Miatton | H03K 17/691 |
| 2022/0376515 A1* | 11/2022 | Singh | H02M 3/158 |
| 2023/0216402 A1* | 7/2023 | Metayer | H02M 3/156 323/282 |

FOREIGN PATENT DOCUMENTS

| | | |
|---|---|---|
| EP | 2541349 A2 | 1/2013 |
| EP | 3203597 A1 | 8/2017 |
| EP | 3224079 A1 | 10/2017 |
| EP | 3264578 A1 | 1/2018 |
| EP | 3288170 A1 | 2/2018 |
| WO | 9944276 A1 | 9/1999 |
| WO | 2013112553 A1 | 1/2013 |
| WO | 2016083714 A1 | 6/2016 |
| WO | 2018032755 A1 | 2/2018 |

OTHER PUBLICATIONS

Shi et al., "Digital Control of Induction Machines as a Backup Control Strategy for Fault Tolerant Operation of Traction Motors", IEEE Journal of Emerging and Selected Topics in Power Electronics, Sep. 1, 2014, pp. 651-658, vol. 2, No. 3.

Texas Instruments, "10-kW, Three-Level, Three-Phase Grid Tie Inverter Reference Design for Solar String Inverters", Mar. 31, 2018, retrieved from the internet at https://www.ti.com/lit/ug/tidue53a/tidue53a.pdf on Feb. 18, 2019, 38 pages.

Texas Instruments, "Automotive 400-W, 48-V Battery Input, 12-V Output Power Reference Design", Jul. 31, 2017, retrieved from the internet at https://www.ti.com/lit/ug/tiduda3/tiduda3.pdf?ts=1616666959206&ref_url=https%3A%2F%2Fwww.ti.com%2Ftool%2FTIDA-01407 on Mar. 25, 2021, 42 pages.

Basile Bart: "POWERCARD Assembly TIDA-01606E4", Dec. 27, 2017 (Dec. 27, 2017), XP055789819, Retrieved from the Internet: URL:https://www.ti.com/tool/TIDA-01606.

Basile Bart: "Gate Driver Assembly TIDA-01606E4", Dec. 27, 2017 (Dec. 27, 2017), XP055789817, Retrieved from the Internet: URL:https://www.ti.com/tool/TIDA-01606.

* cited by examiner

ADVANCE SUPPLY TO INSURE SAFE BEHAVIOR OF AN INVERTER APPLICATION

BACKGROUND

Electric motors are found in many machines including industrial fans, pumps, electric vehicles, etc. Most electric motors operate through an interaction between the motor's magnetic field and electric current in a wire winding. In electric vehicles (EVs) the interaction generates a force in the form of torque that is applied to the motor's shaft, which in turn propels the EV.

Microcontrollers or other processor based devices (e.g., a system on a chip) control electric motors in EVs and other machines via inverter systems. In basic terms, an inverter system can change direct current (DC) power from a battery to alternating current (AC) power for use by the electric motor. The present disclosure will be described with reference to inverter systems of EV motors, it being understood the present disclosure should not be limited to use of inverter systems of EV motors.

SUMMARY

Aspects of the disclosure are defined in the accompanying claims.

In a first aspect, there is provided an apparatus comprising: a first high side gate driver; a first low side gate driver; a microcontroller configured to control the first high side and low side gate drivers; a voltage regulator for providing a supply voltage to the microcontroller; a first pair of high side voltage regulators for providing a first pair of high side supply voltages to the first high side gate driver; a first pair of low side voltage regulators for providing a first pair of low side supply voltages to the first low side gate driver.

In one or more embodiments, the first pair of high side voltage regulators may be enabled by a signal provided by a device other than the microcontroller.

In one or more embodiments, the first high side gate driver may comprise low and high voltage stages that are galvanically isolated from each other; the first pair of high side voltage regulators may comprise first and second voltage regulators; the first pair of high side supply voltages may comprise first and second supply voltages; the first voltage regulator may be configured to provide the first supply voltage to the low voltage stage; the second voltage regulator may be configured to provide the second supply voltage to the high voltage stage.

In one or more embodiments, the first low side gate driver may comprise low and high voltage stages that are galvanically isolated from each other; the first pair of low side voltage regulators may comprise first and second voltage regulators; the first pair of low side supply voltages may comprise first and second supply voltages; the first voltage regulator of the first pair of low side voltage regulators may be configured to provide the first supply voltage of the first pair of low side supply voltages to the low voltage stage of the low side gate driver; the second voltage regulator of the first pair of low side voltage regulators may be configured to provide the second supply voltage of the first pair of low side supply voltages to the high voltage stage of the low side gate driver.

In one or more embodiments, the apparatus may further comprise: a first terminal for receiving a first positive battery voltage; a second terminal for receiving a second positive battery voltage that is substantially equal to the first positive battery voltage; first and second diodes comprising first and second anodes, respectively, and first and second cathodes, respectively; wherein the first and second anodes may be connected to the first and second terminals, respectively; wherein the first and second cathodes may be connected together to provide a common voltage that depends on the first or second positive battery voltages; wherein the second voltage regulator may be configured to convert the common voltage into the second supply voltage for the high voltage stage; wherein the voltage regulator may be configured to convert the common voltage, or another voltage that is dependent on the common voltage, into the supply voltage for the microcontroller.

In one or more embodiments, the second voltage regulator may be configured to convert the common voltage into a third supply voltage; wherein the first voltage regulator may be configured to convert the third supply voltage into the first voltage for the low voltage stage.

In one or more embodiments, the apparatus may further comprise a circuit for monitoring the microcontroller, the first high side gate driver and the first low side gate driver, wherein the monitoring circuit may be configured to control the first high side and low side gate drivers in response to detecting a failure of the microcontroller or in response to detecting an error in the first high side gate driver or the first low side gate driver.

In one or more embodiments, the apparatus may further comprise: a second high side gate driver coupled to receive the first pair of high side supply voltages; a second low side gate driver coupled to receive the a first pair of low side supply voltages.

In one or more embodiments, the apparatus may further comprise: a second high side gate driver; a second low side gate driver; a second pair of high side voltage regulators for providing a second pair of high side supply voltages to the second high side gate driver; a second pair of low side voltage regulators for providing a second pair of low side supply voltages to the second low side gate driver.

In one or more embodiments, the apparatus may further comprise: a first high side power switch comprising a gate terminal, a first terminal and a second terminal; a second power switch comprising a gate terminal, a first terminal and a second terminal; wherein the second terminal of the first high side power switch may be coupled to the first terminal of the second power switch; the first gate may be coupled to the first high side gate driver; the first gate may be coupled to the second high side gate driver.

In a second aspect, there is provided an apparatus comprising: a first high side gate driver; a first low side gate driver; a microcontroller configured to control the first high side and low side gate drivers via high side and low side pulse-width modulation signals, respectively; a voltage regulator for providing a supply voltage to the microcontroller; a first pair of high side voltage regulators for providing a first pair of high side supply voltages to the first high side gate driver; wherein the first pair of high side voltage regulators are enabled by a signal provided by a device other than the microcontroller.

In one or more embodiments, the apparatus may further comprise a first pair of low side voltage regulators for providing a first pair of low side supply voltages to the first low side gate driver.

In one or more embodiments, the first high side gate driver may comprise low and high voltage stages that are galvanically isolated from each other; the first pair of high side voltage regulators may comprise first and second voltage regulators; the first pair of high side supply voltages may comprise first and second supply voltages; the first voltage regulator may be configured to provide the first supply voltage to the low voltage stage; the second voltage regulator may be configured to provide the second supply voltage to the high voltage stage.

In one or more embodiments, the first low side gate driver may comprise low and high voltage stages that are galvanically isolated from each other; the first pair of low side voltage regulators may comprise first and second voltage regulators; the first pair of low side supply voltages may comprise first and second supply voltages; the first voltage regulator of the first pair of low side voltage regulators may be configured to provide the first supply voltage of the first pair of low side supply voltages to the low voltage stage of the low side gate driver; the second voltage regulator of the first pair of low side voltage regulators may be configured to provide the second supply voltage of the first pair of low side supply voltages to the high voltage stage of the low side gate driver.

In one or more embodiments, the apparatus may further comprise: a first terminal for receiving a first positive battery voltage; a second terminal for receiving a second positive battery voltage that is substantially equal to the first positive battery voltage; first and second diodes comprising first and second anodes, respectively, and first and second cathodes, respectively; wherein the first and second anodes may be connected to the first and second terminals, respectively; the first and second cathodes may be connected together to provide a common voltage that depends on the first or second positive battery voltages; the second voltage regulator may be configured to convert the common voltage into the second supply voltage for the high voltage stage; the voltage regulator may be configured to convert the common voltage, or another voltage that is dependent on the common voltage, into the supply voltage for the microcontroller.

In one or more embodiments, the second voltage regulator may be configured to convert the common voltage into a third supply voltage; the first voltage regulator may be configured to convert the third supply voltage into the first voltage for the low voltage stage.

In one or more embodiments, the apparatus may further comprise a circuit for monitoring the microcontroller, the first high side gate driver and the first low side gate driver, wherein the monitoring circuit may be configured to control the first high side and low side gate drivers in response to detecting a failure of the microcontroller or in response to detecting an error in the first high side gate driver or the first low side gate driver.

In one or more embodiments, the apparatus may further comprise: a second high side gate driver coupled to receive the first pair of high side supply voltages; a second low side gate driver coupled to receive the a first pair of low side supply voltages.

In one or more embodiments, the apparatus may further comprise: a second high side gate driver; a second low side gate driver; a second pair of high side voltage regulators for providing a second pair of high side supply voltages to the second high side gate driver; a second pair of low side voltage regulators for providing a second pair of low side supply voltages to the second low side gate driver.

In one or more embodiments, the apparatus may further comprise: a first high side power switch comprising a gate terminal, a first terminal and a second terminal; a second power switch comprising a gate terminal, a first terminal and a second terminal; wherein the second terminal of the first high side power switch may be coupled to the first terminal of the second power switch; the first gate may be coupled to the first high side gate driver; the first gate may be coupled to the second high side gate driver.

BRIEF DESCRIPTION OF THE DRAWINGS

It will be appreciated that for simplicity and clarity of illustration, elements illustrated in the figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

Figure 1:
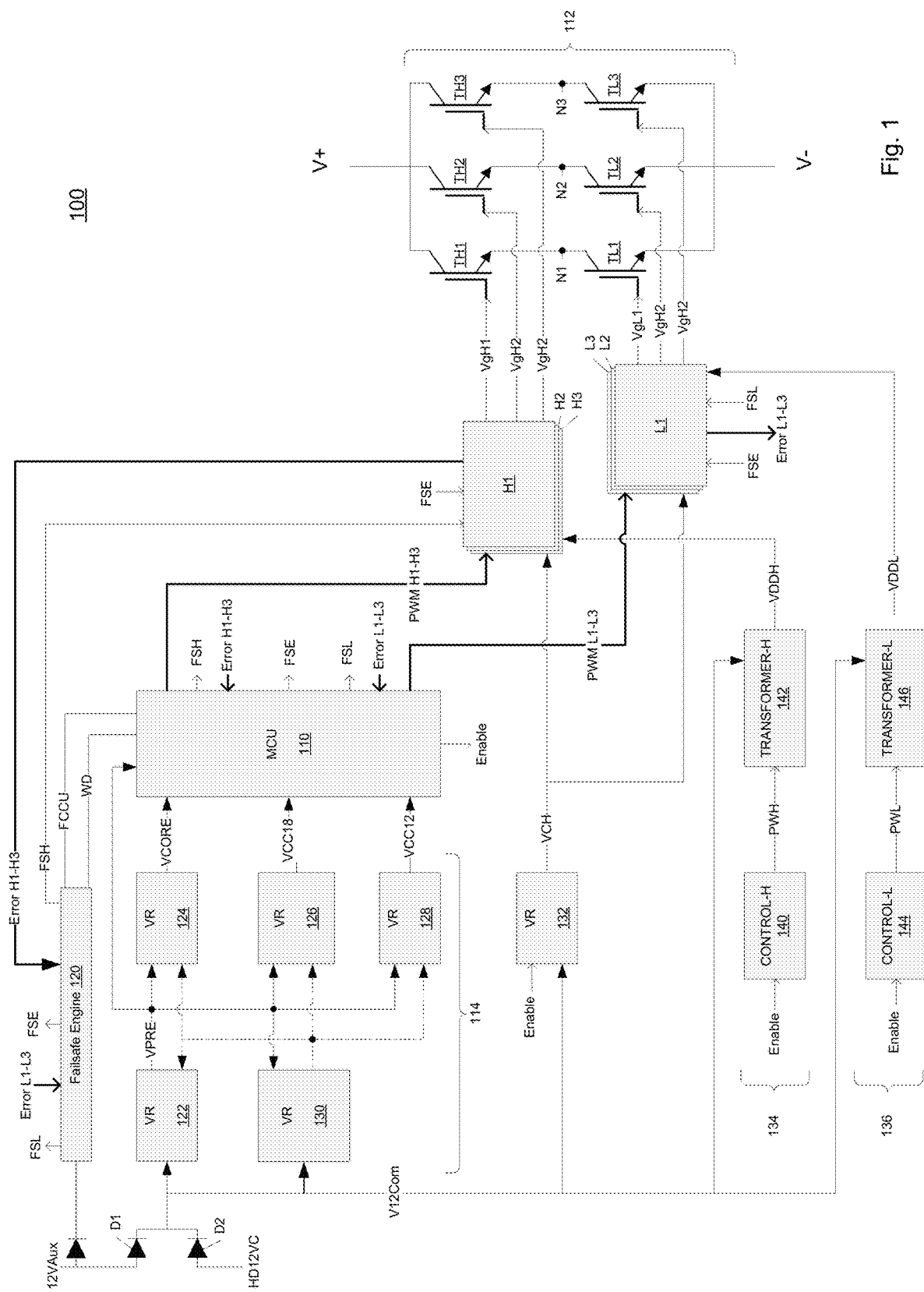
FIG. 1 illustrates relevant components of an example EV motor system.

FIG. 1 shows relevant components of an example electric motor system 100, which can be employed in an EV. Electric motor systems may also include elements beyond that shown in FIG. 1 or other figures in this disclosure. System 100 includes a microcontroller (MCU) 110 that controls an example three-phase, pulse-width modulation (PWM) inverter system 112. The inverter system 112 includes high side power transistors TH1-TH3 connected in series with low side power transistors TL1-TL3 via nodes N1-N3, which in turn are respectively connected to terminals of respective wire windings (not shown). For purposes of explanation only, power transistors TH1-TH3 and TL1-TL3 take form in insulated-gate bipolar transistors (IGBTs), it being understood the term power transistor should not be limited thereto. The collectors of high side transistors TH1-TH3 are connected to a positive terminal voltage V+ (e.g., 12V, 48V, 1 kV, etc.) of a battery, while the emitters of low side transistors TL1-TL3 are connected to a negative terminal voltage V− of the battery.

Figure 2:
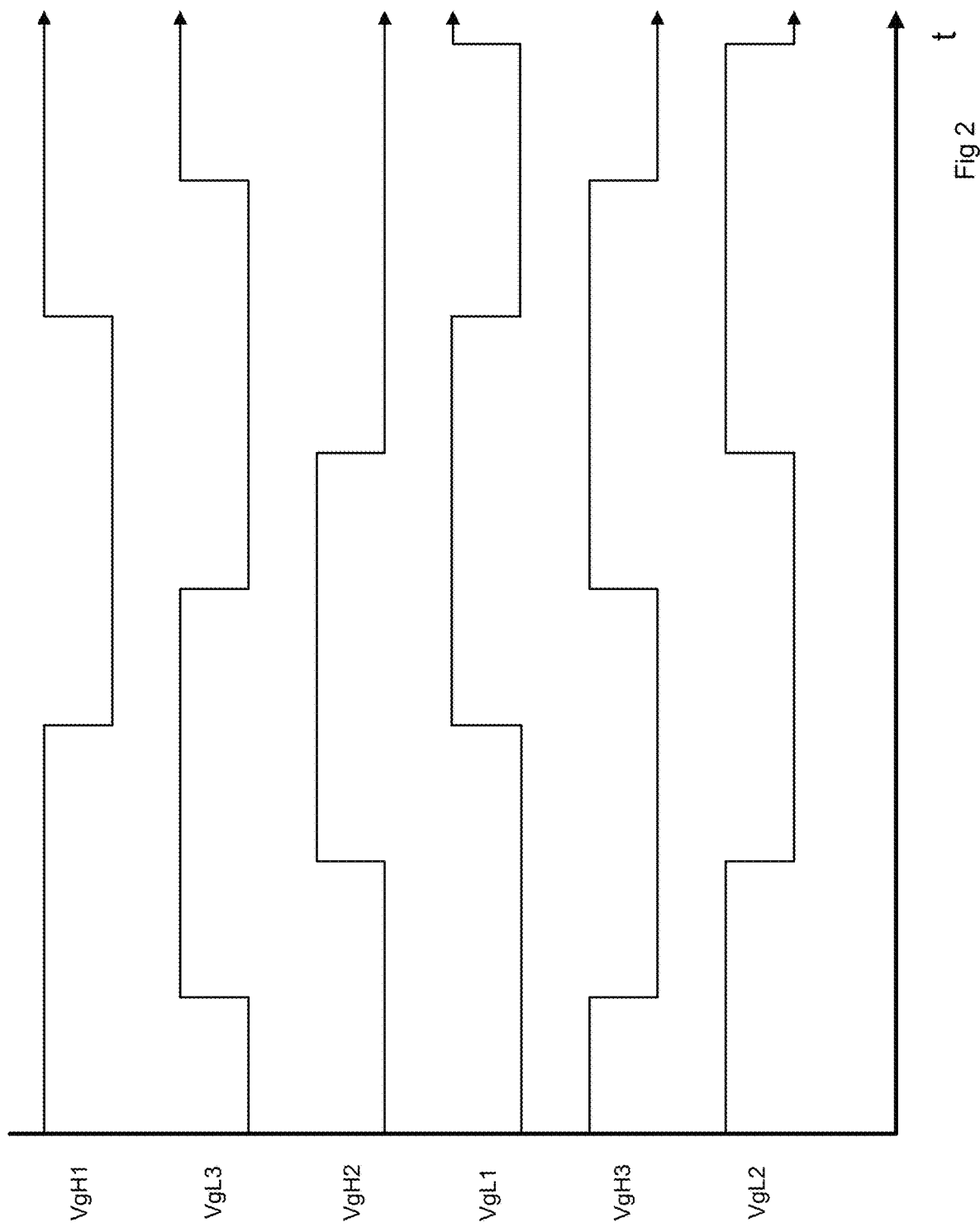
FIG. 2 is a timing diagram illustrating example control signals applied to the transistors of FIG. 1.

MCU 110 control of inverter system 112 is relatively simple. High side gate drivers H1-H3 and low side gate drivers L1-L3 receive pulse width modulation driver control signals PWM-H1-PWM-H3 and PWM-L1-PWM-L3 from MCU 110. In response high side gate drivers H1-H3 selectively activate high side transistors TH1-TH3, respectively, via gate control voltages VgH1-VgH3, respectively, and low side gate drivers L1-L3 selectively activate low side transistors TL1-TL3, respectively, via gate control voltages VgL1-VgL3, respectively. If functioning properly, each of the power transistors should conduct current to or from a corresponding winding when activated by its gate driver. Through coordinated activation of the high side and low side transistors, the direction of the current in the windings are continuously and regularly flip-flopped (current travels into a winding, then abruptly reverses and flows back out). FIG. 2 illustrate an example timing diagram for gate control voltages VgH1-VgH3 and VgL1-VgL3. The interaction between a magnetic field of a rotor, which is coupled to a drive shaft, and the changing electric current in the wire windings creates rotational force that propels the EV.

MCU 110 is a compact integrated circuit. Although not shown, MCU 110 includes a central processing unit (CPU), memory, and peripherals such as timers, input/output (I/O) ports, etc., on a single chip. The CPU can program the timers in accordance with software executing on the CPU. Once programmed and started, these timers can autonomously generate driver control signals PWM-H1-PWM-H3 and PWM-L1-PWM-L3. Gate drivers H1-H3 generate gate control voltages VgH1-VgH3 based on driver control signals PWM-H1-PWM-H3, and gate drivers L1-L3 generate gate control voltages VgL1-VgL3 based on driver control signals PWM-L1-PWM-L3. The CPU may reprogram the timers in order to adjust duty cycle and period of the driver control signals, which in turn adjusts the duty cycle and period of the gate control signals, which in turn adjusts the rotational speed of the EV's drive shaft.

System 100 includes a power supply integrated circuit (IC) 114 for supplying power to MCU 110. Power IC 114 includes voltage regulators 122-130. Additional voltage regulators 132-136 are included in system 100. A voltage regulator is a circuit that provides a constant (i.e., stabilized) output voltage based on an input voltage, regardless of a change in the input voltage. It can do this many ways depending on the topology (e.g., linear regulator, switching regulator, etc.) of the circuit. Voltage regulators 122-128 and 132-136 output stabilized supply voltages to MCU 110, high side gate drivers H1-H3, and low side gate drivers L1-L3. A supply voltage is a voltage that is required by a device, such as a MCU or gate driver, to make it work as designed.

Voltage regulator 122 outputs VPRE (e.g., 3.3 V) based on input voltage V12Com (e.g., 12 V), which is provided at the connected cathodes of diodes D1 and D2. The anode of diode D1 is connected to positive terminal voltage 12V Aux of a first battery (not shown), while the anode of diode D2 is connected to positive terminal voltage HD12VC of a second battery (not shown). Voltage VPRE is provided as a first supply voltage to MCU 110, and as input voltage to voltage regulators 124-130. Voltage regulator 124 outputs VCORE (e.g., 0.8 V) as a second supply voltage to MCU 110. Voltage regulator 126 outputs VCC18 (1.8 V) as a third supply voltage MCU 110. Voltage regulator 128 outputs VCC12 (e.g. 1.2 V) as fourth supply voltage to MCU 110.

Voltage regulator 130 receives V12Com and VPRE as input voltages. Voltage regulator selects the best of input voltages V12Com and VPRE for generating a biasing voltage VBOS for voltage regulators 122-128. For example, voltage regulator 122 does not output VPRE for a period of time during power up, and as a result voltage regulator 130 outputs VBOS based on V12Com. After voltage regulator 122 provides VPRE, voltage regulator 130 regulates VBOS based on VPRE to minimize power dissipation. If voltage regulator 122 fails or is otherwise incapable of outputting VPRE, voltage regulator 130 can once again output VBOS based on V12Com.

Voltage regulators 132-136 are not contained in the power supply IC 114. Voltage regulators 132-136 receive V12Com as input. Voltage regulator 132, when enabled by MCU 110, outputs VCH (e.g., 5.0 V) as a supply voltage to low-voltage stages of gate drivers H1-H3 and L1-L3. Voltage regulator 134, when enabled by MCU 110, outputs VDDH as a supply voltage to high-voltage stages of gate drivers H1-H3. Voltage regulator 136, when enabled by MCU 110, outputs VDDL as a supply voltage to the high-voltage stages of gate drivers L1-L3.

Voltage regulators 134 and 136 take form in flyback transformers. Flyback transformer 134 includes a control IC 140 that regulates the VDDH output of a transformer 142 via pulse width modulation signal PWH. Flyback transformer 136 includes a control IC 144 that regulates the VDDL output of a transformer 146 via pulse width modulation signal PWML.

Inverter systems are susceptible to faults or failures. For example, harsh environmental factors can lead to an electrical short in one of the power transistors TH1-TH3-TL1-TL3. Some faults or failures can cause substantial damage to the EV in which the inverter system is employed. For example a short across TH1 can cause battery overload. Each of the gate drivers H1-H3 and L1-L3 can detect internal or external failures or faults. If a gate driver detects a fault or failure it will assert a corresponding error signal Error. For example, gate driver H1 may detect TH1 is short circuited, and as a result gate driver H1 will assert Error H1.

The primary purpose of the MCU 110 is to control inverter system 112 as described above. MCU can also monitor inverter system 110 in general, and gate drivers H1-H3 and L1-L3 in particular, for faults or failures. As noted, a gate driver can assert an error signal Error if the gate driver detects a fault or failure. MCU 110 receives and monitors error signals Error H1-H3 and Error L1-L3 from the gate drivers. If one of the error signals Error H1-H3 and Error L1-L3 is asserted, MCU 110 can respond by activating a safe state to prevent damage (e.g., battery overload). A safe state can be activated by asserting a failsafe enable signal FSE, and asserting one of the failsafe state signals FSH and FSL while deasserting the other. For example, suppose gate driver L1 detects a short across transistor TL1, and asserts Error L1 (e.g., Error L1=0V). In response MCU 110 should assert both failsafe enable signal FSE and low side failsafe signal FSL, and de-assert high side failsafe signal FSH. In response to receiving these signals, high-side gate drivers H1-H3 deactivate or open power transistors TH1-TH3, and low side gate drivers L1-L3 activate or close power transistors TL1-TL3. Or suppose gate driver H1 detects a short across transistor TH1, and asserts Error H1 (e.g., Error H1=0V). In response MCU 110 should assert failsafe enable signal FSE and high side failsafe signal FSH, and de-assert low side failsafe signal FSL. In response to receiving these signals, high side gate drivers H1-H3 activate or close power transistors TH1-TH3, and low side gate drivers L1-L3 de-activate or open power transistors TL1-TL3.

Unfortunately, MCUs can malfunction or fail for a variety of reasons. For example, an internal flaw of hardware or software within MCU 110 may lead to MCU 110's inability to detect and respond to an assertion of an error signal from one of the gate drivers H1-H3 or L1-L3. Or MCU 110 may fail because voltage regulator 122 fails and does not supply voltage VPRE to MCU 110 and voltage regulators 124-128. Without supply voltages VPRE, VCORE, VCC18 or VCC12, MCU 110 cannot operate.

Failsafe modules are provided alongside MCUs and act as safety backups thereto. Power supply IC 114 includes a failsafe module (e.g., failsafe engine 120), which may take form in a combinational logic circuit. Failsafe engine 120 can monitor MCU 110 via FCCU and WD signals, and gate drivers H1-H3 and L1-L3 via error signal outputs Error H1-H3 and Error L1-L3. If failsafe engine 120 detects MCU 110 malfunction or failure, or the assertion of an error signal by one of the gate drivers, then failsafe engine 120 can activate an appropriate safe state for inverter system 112. For example, suppose failsafe engine detects MCU 110 failure. In response, failsafe engine 120 can assert FSE and FSH, and de-assert FSL. In response to receiving these signals, high side gate drivers H1-H3 activate or close power transistors TH1-TH3, and low side gate drivers L1-L3 de-activate or open power transistors TL1-TL3, so long as voltage regulators 132-136 are providing the supply voltages needed by the gate drivers to respond to the output signals of failsafe engine 120 and implement the safe state. Or suppose failsafe engine 120 detects an assertion of error signal Error L1 by gate driver L1. In response failsafe engine 120 can assert FSE and FSL, and de-assert FSH. In response to receiving these signals, high side gate drivers H1-H3 open power transistors TH1-TH3, and low side gate drivers L1-L3 close power transistors TL1-TL3, again, so long as voltage regulators 132-136 are providing the supply voltages needed by the gate drivers to implement the safe state.

Unfortunately, if MCU 110 malfunctions or fails, it may be incapable of asserting the signal (i.e., the "enable" signal) for enabling voltage regulators 132-136. Another problem may occur if voltage regulator 132 fails and cannot output supply voltage VCH. In both examples the gate drivers H1-H3 and L1-L3 may not receive the supply voltage(s) needed to operate and implement the safe state defined by the FSE, FSL, and FSH signals they receive.

Figure 3:
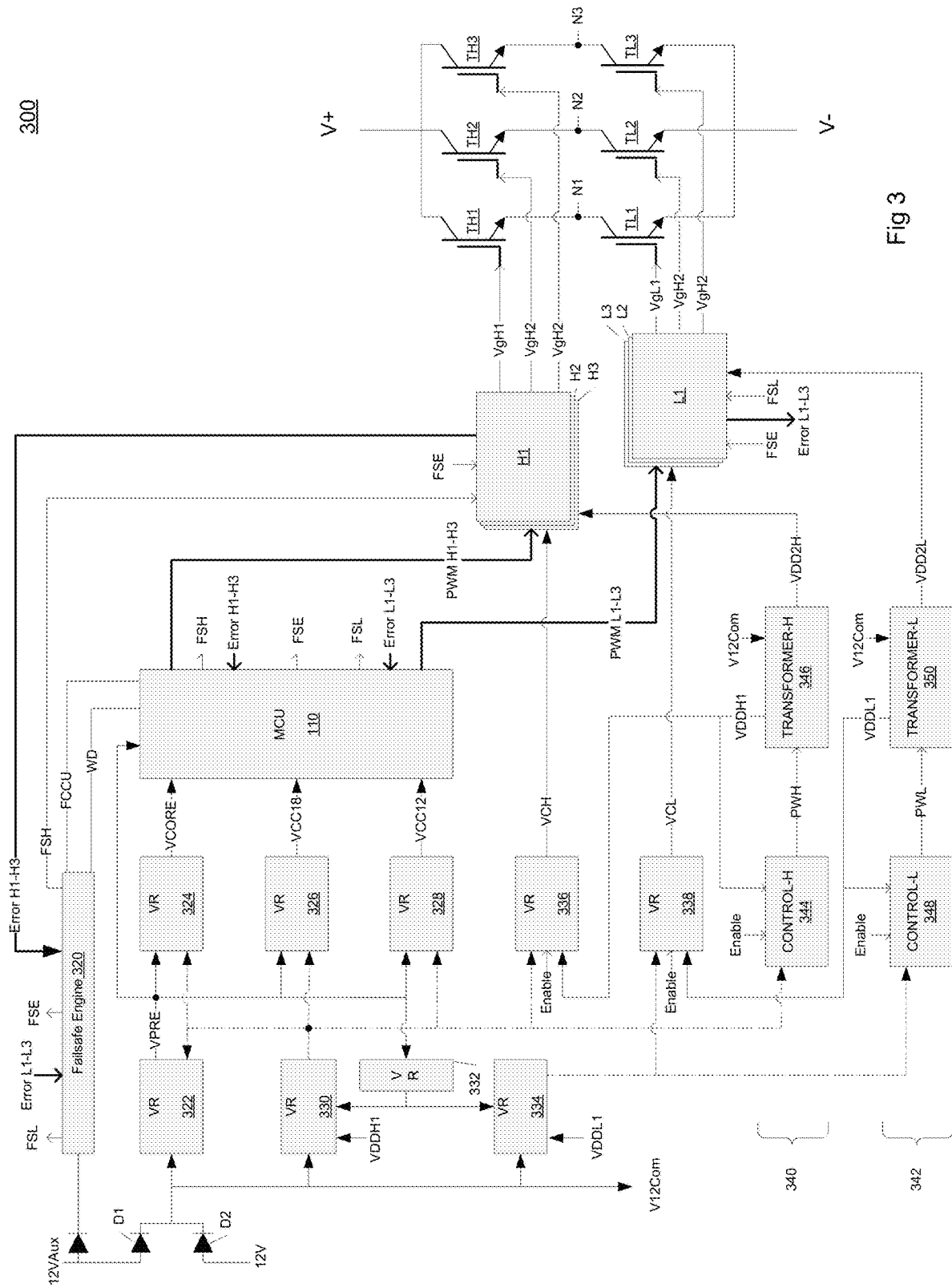
FIG. 3 illustrates relevant components of an example EV motor system according to one embodiment of the present disclosure.

FIG. 3 illustrates relevant components of an example electric motor system 300 employing one embodiment of the present disclosure, which addresses problems described above and others. System 300 and system 100 of FIG. 1 share many common components. For example, system 300 includes the same MCU 110 that controls the three-phase, PWM inverter system, which includes high side power transistors TH1-TH3 connected in series with low side power transistors TL1-TL3, respectively, via terminal nodes N1-N3, respectively. In addition system 300 includes the same high side gate drivers H1-H3 and low side gate drivers L1-L3 that receive driver control signals PWM-H1-PWM-H3 and PWM-L1-PWM-L3 from MCU 110.

System 300 includes voltage regulators 322-342. Regulators 322-334 may be included on a compact integrated circuit hereinafter referred to as a power management integrated circuit (PMIC). Voltage regulators 336 and 338 and/or some but not all components of voltage regulators 340 and 342, may also be included in the PMIC. Voltage regulators 322-328 and 336-342 output stabilized supply voltages to MCU 110, high side gate drivers H1-H3, and low side gate drivers L1-L3.

Voltage regulator 322 receives DC input voltage V12Com. Voltage regular 322 converts voltage V12Com into VPRE, which in turn is provided to MCU 110 as a first supply voltage. Voltage regulator 322 also provides VPRE to voltage regulators 324-328 and 332 as input voltages. Voltage regulator 324 converts VPRE into VCORE (e.g., 0.8 V), which in turn is provided to MCU 110 as a second supply voltage. Voltage regulator 326 converts VPRE into VCC18 (e.g., 1.8 V), which in turn is provided to MCU 110 as third supply voltage. Voltage regulator 328 converts VPRE into VCC12 (e.g. 1.2 V), which in turn is provided to MCU 110 as fourth supply voltage.

Voltage regulators 340 and 342 may take form in flyback transformers in the illustrated embodiment. Flyback transformer 340, which is more fully described below, includes a control IC 344 that regulates output voltages VHDD1 and VHDD2 of transformer 346 via pulse width modulation signal PWH, while flyback transformer 342 includes a control IC 348 that regulates output voltages VLDD1 and VLDD2 of transformer 350 via pulse width modulation signal PWML. Control ICs 344 and 348 may be contained in the same semiconductor die (i.e., the PMIC) that contains voltage regulators 322-338.

Voltage regulator 336 receives VDDH1 from voltage regulator 340 as an input voltage. Voltage regulator 336, when enabled, converts VDDH1 to VCH for use by low-voltage stages of gate drivers H1-H3 as a supply voltage. Voltage regulator 338 receives VDDL1 from voltage regulator 342 as an input voltage. Voltage regulator 338, when enabled, converts VDDL1 to VCL for use by low-voltage stages of gate drivers L1-L3 as a supply voltage. Importantly, voltage regulators 336 and 338 are not enabled by a signal from MCU 110. Voltage regulators 336 and 338 operate independent of each other.

Figure 4:
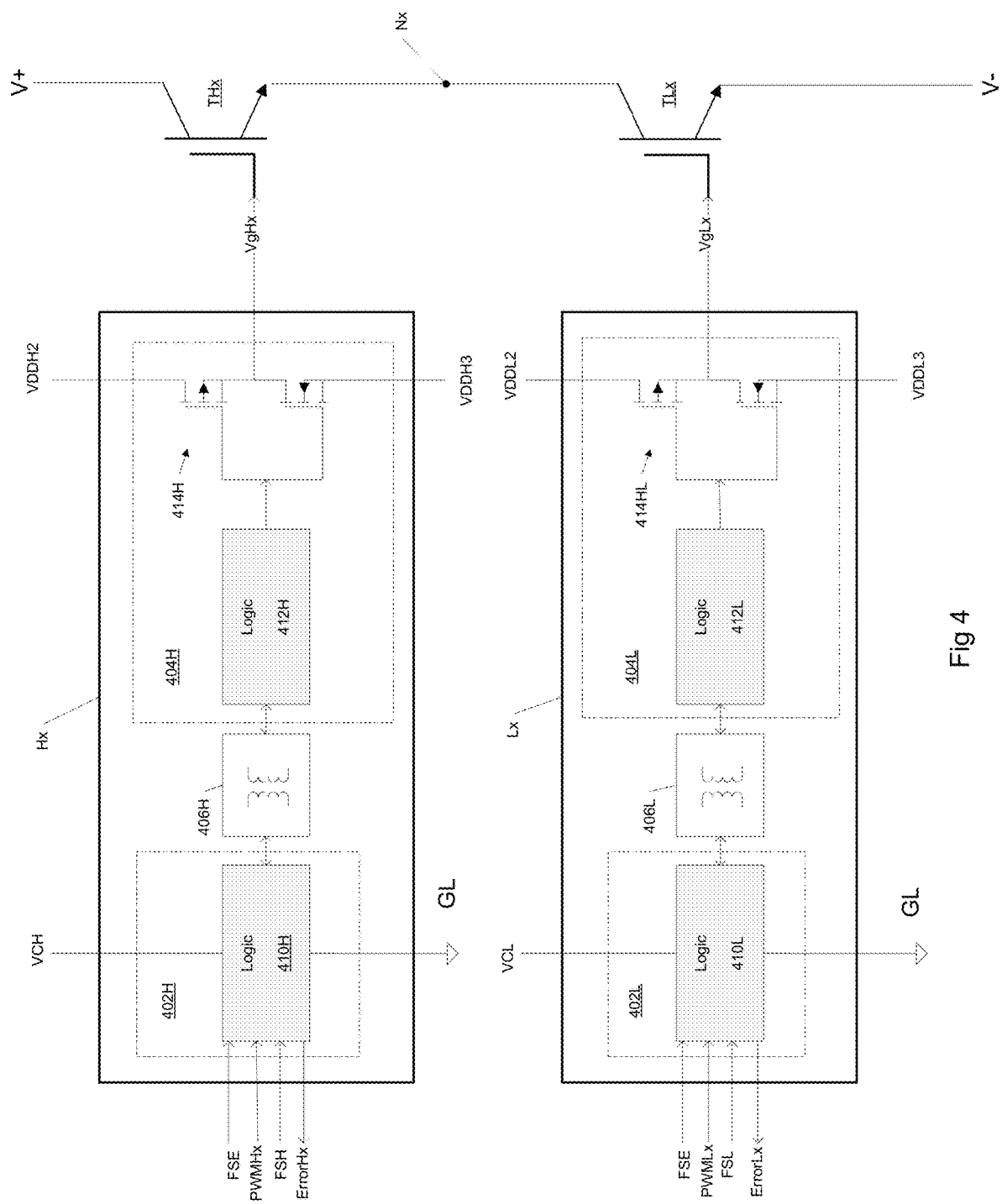
FIG. 4 illustrates relevant components of example high side and low side gate drivers employed in the embodiments of FIGS. 1 and 3.

With continuing reference to FIG. 3, FIG. 4 illustrates example gate drivers Hx and Lx, which include example low-voltage and high-voltage stages. High side gate driver Hx includes low-voltage stage 402H in data communication with high-voltage stage 404H via galvanic isolation circuit 406H. Galvanic isolation is used where two or more circuits must communicate, but their grounds are at different potentials. Galvanic isolation circuits may employ a transformer, capacitor, optical coupler, or other device to achieve the isolation between circuits. For purposes of explanation only, galvanic isolation circuit 406H employs a transformer to implement galvanic isolation. The low-voltage input stage 402H is coupled to receive supply voltage VCH from voltage regulator 336, and includes a logic circuit 410H that receives driver control signal PWM-Hx, and safe state control signals FSE and FSH. The high-voltage output stage 404H is coupled to receive supply voltage VDDH2 from voltage regulator 340, which is more fully described below, and includes a logic circuit 412H that receives a control signal from logic circuit 410H via galvanic isolation circuit 406H. High-voltage output stage 404H also includes a buffer 414H that is controlled by an output signal from logic circuit 412H.

Low-side gate driver Lx includes low-voltage stage 402L in data communication with high-voltage stage 404L via galvanic isolation circuit 406L. The low-voltage input stage 402H is coupled to receive supply voltage VCL from voltage regulator 336, and includes a logic circuit 410L that receives driver control signal PWM-Lx from MCU 110, and safe state control signals FSE and FSL. The high-voltage stage 404L is coupled to receive supply voltage VDDL2 from voltage regulator 342, which is more fully described below, and includes a logic circuit 412L that receives a control signal from logic circuit 410L via galvanic isolation circuit 406L. High-voltage output stage 404L also includes a buffer 414L that is controlled by logic circuit 412L.

With continuing reference to FIG. 3, voltage regulators 340 and 342 take form in flyback transformers in the example embodiment. Voltage regulators 340 and 342 operate independent of each other and the other. Flyback transformers 340 and 342 receive V12Com as input voltages. Flyback transformer 340 converts V12Com into distinct output voltages VDDH1 and VDDH2. Flyback transformer 342 converts V12Com into distinct output voltages VDDL1 and VDDL2.

Figure 5:
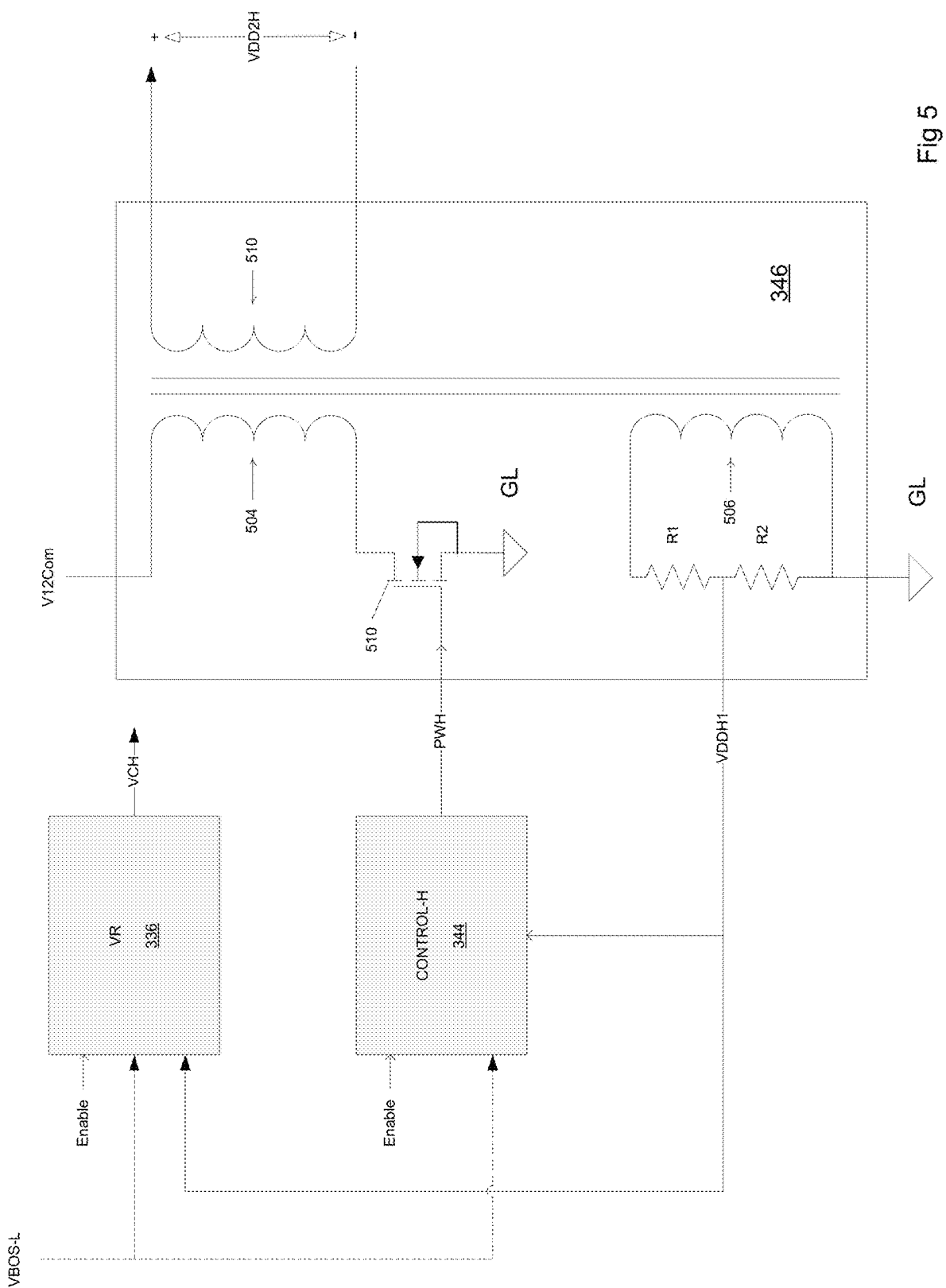
FIG. 5 illustrates relevant components of example transformer unit employed in the embodiment of FIG. 3.

Flyback transformers 340 and 342 output VDD2H and VDD2L, respectively, to gate drivers H1-H3 and L1-L3, respectively, as supply voltages. Flyback transformers 340 and 342 output VDD1H and VDD1L, respectively, to voltage regulators 336 and 338, respectively as input voltages thereto. Voltage regulators 336 and 338 convert input voltages VDD1H and VDD1L, respectively, into supply voltages VCH and VCL, respectively, mentioned above. Flyback transformer 340 includes a control IC 344 and transformer 346, while flyback transformer 342 includes control IC 348 and transformer 350. FIG. 5 illustrates example transformer 346. Transformer 350 is presumed to have similar structure. For ease of explanation FIG. 5 also shows control IC 344 and voltage regulator 336.

Transformers can have multiple windings in either the primary or secondary side. Transformer 346 includes a pair windings 504 and 506 in the primary side, and a single winding 508 in the secondary side. Transformer 346 also includes a MOSFET 510 that is controlled by PWH from controller 344. MOSFET 510 is coupled between primary side winding 504 and ground GL. Winding 504 is coupled to supply voltage V12Com. Primary side winding 506 is coupled to resistor divider that includes resistors R1 and R2 connected in series as shown. Primary side winding 506 is also coupled to ground GL. Control IC 344 uses VDDH1 produced across resistor R2 as feedback to regulate the duty cycle of PWH, which in turn regulates the supply voltage VDD2H provided to the high-voltage stage of gate drivers H1-H3. And as noted, VDDH1 is also provided to voltage regulator 336 as an input voltage.

With continuing reference to FIGS. 3-5, the VPRE output of voltage regulator is provided to voltage regulator 332 as an input. Voltage regulator 332 boosts VPRE to a higher level. The boosted voltage is provided to voltage regulators 330 and 334 as an input. In addition to receiving boosted VPRE, voltage regulator 330 receives V12Com and supply voltage VDDH1, which is provided by voltage regulator 340. Voltage regulator 330 selects one of its input voltages for use in generating and providing a biasing voltage VBOS-H to voltage regulators 322-328, 336, and 340. The input voltage selection is based upon a predetermined priority. In one embodiment the boosted VPRE provided by 332 is given the highest priority by voltage regulator 330. In addition to receiving boosted VPRE, voltage regulator 334 receives V12Com and supply voltage VDDL1 provided by voltage regulator 342. Voltage regulator 334 selects one of its input voltages for use in generating and providing a biasing voltage VBOS-L for voltage regulators 338 and 342. The input voltage selection is based upon a predetermined priority. In one embodiment the boosted VPRE provided by voltage regulator 332 is given the highest priority by voltage regulator 334.

Like system 100 shown in FIG. 1, system 300 shown within FIG. 3 includes a failsafe module that acts as a backup to MCU 110. In one embodiment the PMIC, which includes voltage regulators such as voltage regulators 336 and 338, includes a failsafe engine 320, which may take form in a combinational logic circuit. Failsafe engine 320 can monitor MCU 110 via FCCU and WD signals, and gate drivers H1-H3 and L1-L3 via error signal outputs Error H1-H3 and Error L1-L3. If failsafe engine 320 detects MCU 110 malfunction or failure, or the assertion of an error signal by one of the gate drivers, then failsafe engine 320 can activate an appropriate safe state for the inverter system. For example, suppose failsafe engine 320 detects MCU 110 failure. In response, failsafe engine 320 can assert FSE and FSH, and de-assert FSL. In response to receiving these signals, high side gate drivers H1-H3 activate or close power transistors TH1-TH3, and low side gate drivers L1-L3 de-activate or open power transistors TL1-TL3. Or suppose failsafe engine 320 detects an assertion of error signal Error L1 by gate driver L1. In response failsafe engine 320 can assert FSE and FSL, and de-assert FSH. In response to receiving these signals, high side gate drivers H1-H3 open power transistors TH1-TH3, and low side gate drivers L1-L3 close power transistors TL1-TL3.

With continuing reference to FIGS. 3-5, gate drivers H1-H3 receive their supply voltages VCH and VDD2H from independent voltage regulators, which are enabled by a device other than MCU 110. Similar gate drivers L1-L3 receive their supply voltages VCL and VDD2L from independent voltage regulators, which are enabled by a device other than MCU 110. If MCU 110 fails, voltage regulators 336-342 should continue to provide gate drivers H1-H3 and L1-L3 with the necessary supply voltages that are needed to implement a safe state in response to control signals FSE, FSH, and FSL from failsafe engine 320. Moreover, given the independence of the voltage regulators 336-342, the failure of one of the voltage regulators 336 or 340, will not affect the operation of voltage regulators 338 and 342, and vice versa. Thus gate drivers H1-H3 can respond to control signals FSE and FSH from failsafe engine 320 or MCU 110 notwithstanding the failure of voltage regulator 338 or 342. Or gate drivers L1-L3 can respond to control signals FSE and FSL from failsafe engine 320 or MCU 110 notwithstanding the failure of voltage regulator 336 or 340. For example, if voltage regulator 336 or voltage regulator 340 fails and cannot provide their respective supply voltages VCH or VDD2H to high side gate drivers H1-H3, low side gate drivers L1-L3 can nonetheless respond to FSE and FSL from MCU 110 or failsafe engine 320 and place TL1-TL3 into a safe state (TL1-TL3 activated or deactivated) since L1-L3 are powered by supply voltages from voltage regulators 338 and 342.

Figure 6:
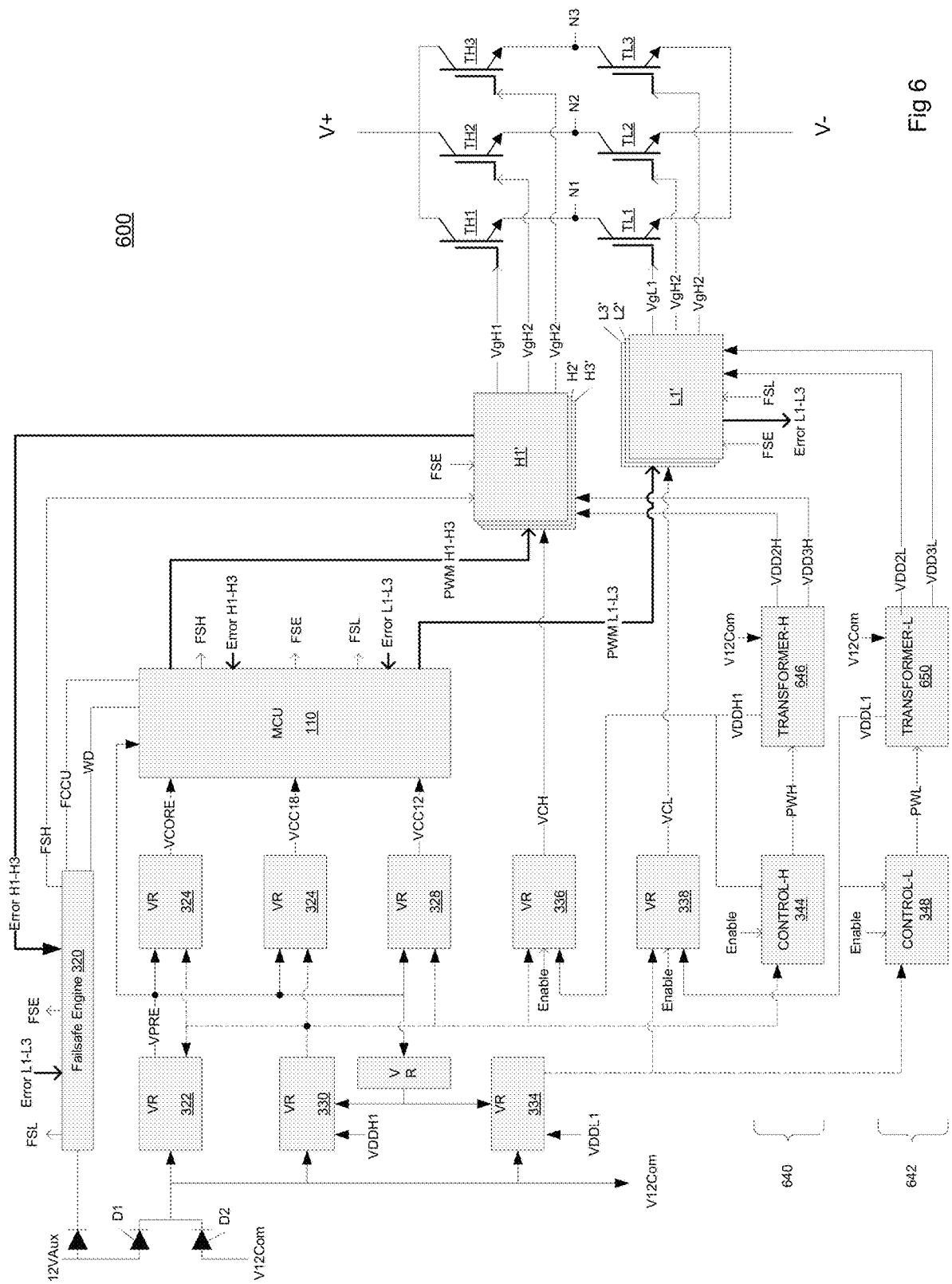
FIG. 6 illustrates relevant components of an example EV motor system according to another embodiment of the present disclosure.

FIG. 6 illustrates a motor system 600 employing an alternative embodiment of the present disclosure. System 600 is similar to system 300 shown in FIG. 3, but with transformers 346 and 350 replaced by transformers 646 and 650, respectively. Additionally, gate drivers H1-H3 and L1-L3 in the system 300 are replaced with gate drivers H1'-H3' and L1'-L3'. In addition to outputting supply voltage VDD2H, transformer 646 outputs supply voltage VDD3H to the high-voltage stages of gate drivers H1'-H3'. Similarly transformer 650 outputs supply voltage VDD3L to the high-voltage stages of gate drivers L1'-L3' in addition to supply voltage VDD2L. Gate drivers H1'-H3' and L1'-L3' need a positive supply voltage VDD2H and VDD2L to turn on their respective IGBTs. Gate drivers may also need a negative voltage to turn off their respective IGBTs. Transformers 646 and 650 can provide negative supply voltages VDD3H and VDD3L to gate drivers H1'-H3' and L1'-L3' as shown, which can be used to turn off respective IGBTs.

Figure 7:
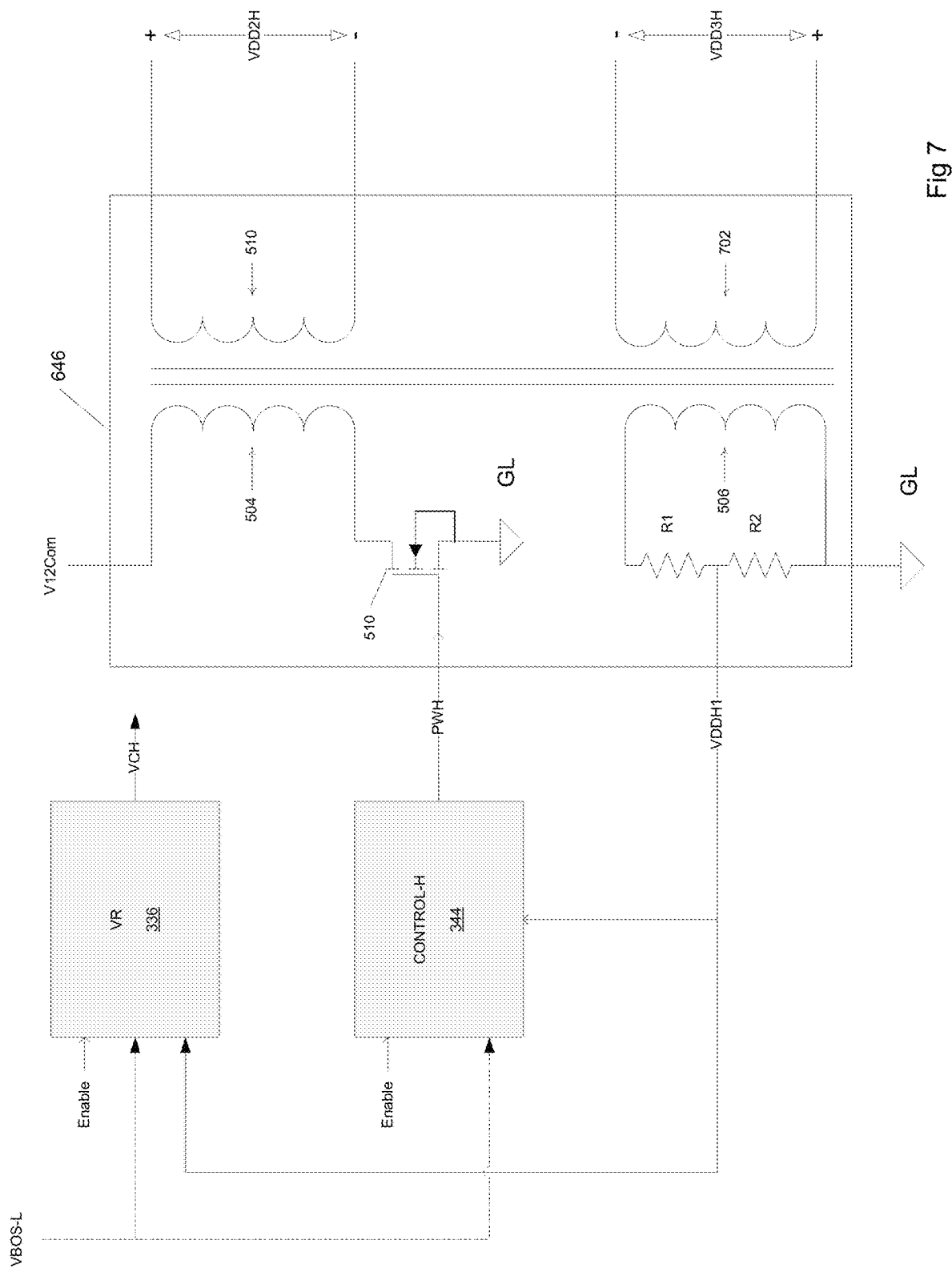
FIG. 7 illustrates relevant components of example transformer unit employed in the embodiment of FIG. 6.

FIG. 7 illustrates one embodiment of transformer 646. Transformer 650 is similarly configured. As shown transformer 646 includes a winding 702 on the secondary side. Outputs supply voltage VDD3H is generated at the terminals of winding 702. Like supply voltage VDD2H, supply voltage VDD3H is regulated by control IC 344 via PWH.

Figure 8:
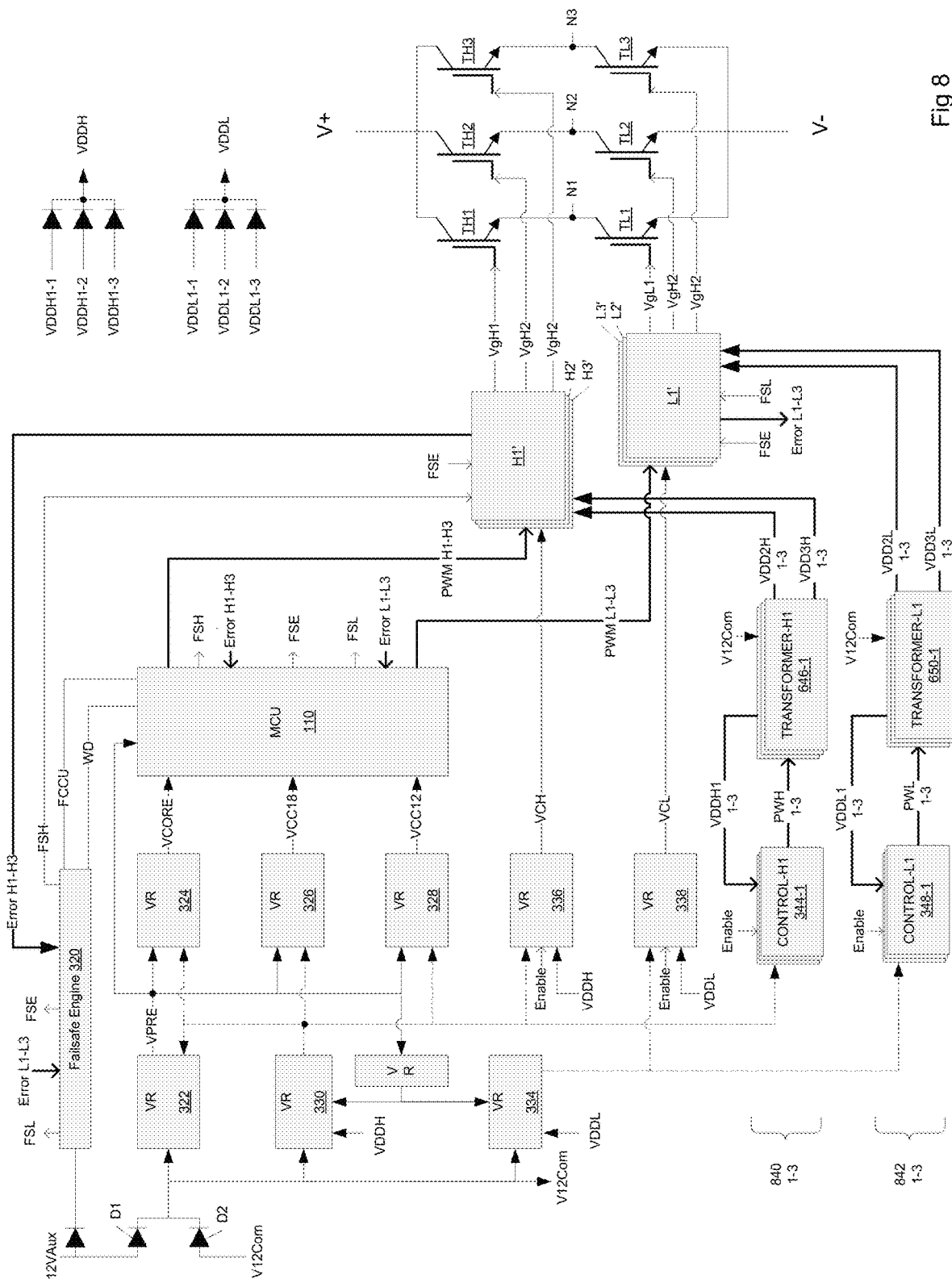
FIG. 8 illustrates relevant components of an example EV motor system according to yet another embodiment of the present disclosure.

FIG. 8 illustrates yet another motor system 800 employing an alternative embodiment of the present disclosure. System 800 is similar to system 600 shown in FIG. 6. However, flyback transformer 340 replaced with three separate flyback transformers 840-1-840-3, and flyback transformer 342 replaced with three separate flyback transformers 842-1-842-3. In this embodiment the high-voltage stages gate drivers H1'-H3' are provided with supply voltages from independent flyback transformers 840-1-840-3, respectively, and the high-voltage stages gate drivers L1'-L3' are provided with supply voltages from independent flyback transformers 842-1-8420-3, respectively. If any one of the flyback transformers 840-1-840-3 and 842-1-842-3 fail, the other five should continue to provide supply voltages to their respective gate drivers. Flyback transformers 840-1-840-3 include control ICs 344-1-344-3, respectively, which are similar to the control IC 344 shown in FIG. 3, and transformers 646-1-646-3, respectively, which are similar to the transformer 646 shown within FIG. 7. Supply voltages VDD2H1-VDD2H3 and VDD3H1-VDD3H3 are regulated by control ICs 344-1-344-3 via pulse width control signals PWH1-PWH3 using VDD1H1-VDD1H3 as respective sense signals. Supply voltages VDD1H1-VDD1H3 are also connected together via respective diodes to provide VDDH as an input voltage to voltage regulators 336 and 330. Flyback transformers 842-1-842-3 include control ICs 348-1-348-3, respectively, which are similar to the control IC 348 shown in FIG. 3, and transformers 650-1-650-3, respectively, which are similar to the transformer 646 shown within FIG. 7. Supply voltages VDD2L1-VDD2L3 and VDD3L1-VDD3L3 are regulated by control ICs 348-1-348-3 via pulse width control signals PWL1-PWL3 using VDD1L1-DD1L3 as respective sense signals. Supply voltages VDD1L1-VDD1L3 are also connected together via respective diodes to provide VDDL as an input voltage to voltage regulators 338 and 334.

By now it should be appreciated that there is provided herein an apparatus to insure safe behavior in an inverter system. In one embodiment, the apparatus includes a first high side gate driver, a first low side gate driver, a microcontroller configured to control the first high side and low side gate drivers. A voltage regulator provides a supply voltage to the microcontroller. A first pair of high side voltage regulators provide a first pair of high side supply voltages to the first high side gate driver. A first pair of low side voltage regulators provide a first pair of low side supply voltages to the first low side gate driver.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An apparatus comprising:
a first high side gate driver;
a first low side gate driver;
a microcontroller configured to control the first high side and low side gate drivers;
a voltage regulator for providing a supply voltage to the microcontroller;
a first pair of high side voltage regulators for providing a first pair of high side supply voltages to the first high side gate driver;
a first pair of low side voltage regulators for providing a first pair of low side supply voltages to the first low side gate driver; and
a failsafe circuit configured to monitor operation of the microcontroller, the first high side gate driver and the first low side gate driver,
wherein the failsafe circuit is configured to control the first high side and low side gate drivers in response to detecting a failure of the microcontroller or in response to detecting an error in the first high side gate driver or the first low side gate driver;
wherein the first pair of high side voltage regulators are coupled to receive the supply voltage and are coupled to receive an on or off enable signal provided by a device other than the microcontroller;
wherein the first pair of low side voltage regulators are coupled to receive the supply voltage and are coupled to receive the on or off enable signal provided by the device other than the microcontroller; and
wherein a first of the first pair of high side voltage regulators also provides a voltage to a second of the first pair of high side voltage regulators.

2. The apparatus of claim 1:
wherein the first high side gate driver comprises low and high voltage stages that are galvanically isolated from each other;
wherein the first pair of high side voltage regulators comprises first and second voltage regulators;
wherein the first pair of high side supply voltages comprises the first and second supply voltages;
wherein the first voltage regulator is configured to provide the first supply voltage to the low voltage stage;
wherein the second voltage regulator is configured to provide the second supply voltage to the high voltage stage.

3. The apparatus of claim 2:
wherein the first low side gate driver comprises low and high voltage stages that are galvanically isolated from each other;
wherein the first pair of low side voltage regulators comprises first and second voltage regulators;
wherein the first pair of low side supply voltages comprises first and second supply voltages;
wherein the first voltage regulator of the first pair of low side voltage regulators is configured to provide the first supply voltage of the first pair of low side supply voltages to the low voltage stage of the low side gate driver;
wherein the second voltage regulator of the first pair of low side voltage regulators is configured to provide the second supply voltage of the first pair of low side supply voltages to the high voltage stage of the low side gate driver.

4. The apparatus of claim 2 further comprising:
a first terminal for receiving a first positive battery voltage;
a second terminal for receiving a second positive battery voltage that is substantially equal to the first positive battery voltage;
first and second diodes comprising first and second anodes, respectively, and first and second cathodes, respectively;
wherein the first and second anodes are connected to the first and second terminals, respectively;
wherein the first and second cathodes are connected together to provide a common voltage that depends on the first or second positive battery voltages;
wherein the second voltage regulator is configured to convert the common voltage into the second supply voltage for the high voltage stage;
wherein the voltage regulator is configured to convert the common voltage, or another voltage that is dependent on the common voltage, into the supply voltage for the microcontroller.

5. The apparatus of claim 4:
wherein the second voltage regulator is configured to convert the common voltage into a third supply voltage;

wherein the first voltage regulator is configured to convert the third supply voltage into the first voltage for the low voltage stage.

6. The apparatus of claim 1 further comprising:
a second high side gate driver coupled to receive the first pair of high side supply voltages;
a second low side gate driver coupled to receive the first pair of low side supply voltages.

7. The apparatus of claim 6 further comprising:
a first high side power switch comprising a gate terminal, a first terminal and a second terminal;
a second power switch comprising a gate terminal, a first terminal and a second terminal;
wherein the second terminal of the first high side power switch is coupled to the first terminal of the second power switch;
wherein the gate terminal of the first high side power switch is coupled to the first high side gate driver;
wherein the gate terminal of the second power switch is coupled to the second high side gate driver.

8. The apparatus of claim 1 further comprising:
a second high side gate driver;
a second low side gate driver;
a second pair of high side voltage regulators for providing a second pair of high side supply voltages to the second high side gate driver;
a second pair of low side voltage regulators for providing a second pair of low side supply voltages to the second low side gate driver.

9. The apparatus of claim 1:
wherein a first of the first pair of low side voltage regulators also provides a voltage to a second of the first pair of low side voltage regulators.

10. An apparatus comprising:
a first high side gate driver;
a first low side gate driver;
a microcontroller configured to control the first high side and low side gate drivers via high side and low side pulse-width modulation signals, respectively;
a voltage regulator for providing a supply voltage to the microcontroller;
a first pair of high side voltage regulators for providing a first pair of high side supply voltages to the first high side gate driver;
wherein the first pair of high side voltage regulators are enabled by a signal provided by a device other than the microcontroller;
a first pair of low side voltage regulators for providing a first pair of low side supply voltages to the first low side gate driver;
wherein the first high side gate driver comprises low and high voltage stages that are galvanically isolated from each other;
wherein the first pair of high side voltage regulators comprises first and second voltage regulators;
wherein the first pair of high side supply voltages comprises first and second supply voltages;
wherein the first voltage regulator is configured to provide the first supply voltage to the low voltage stage;
wherein the second voltage regulator is configured to provide the second supply voltage to the high voltage stage;
further comprising,
a first terminal for receiving a first positive battery voltage;
a second terminal for receiving a second positive battery voltage that is substantially equal to the first positive battery voltage; and
first and second diodes comprising first and second anodes, respectively, and first and second cathodes, respectively;
wherein the first and second anodes are connected to the first and second terminals, respectively;
wherein the first and second cathodes are connected together to provide a common voltage that depends on the first or second positive battery voltages;
wherein the second voltage regulator is configured to convert the common voltage into the second supply voltage for the high voltage stage; and
wherein the voltage regulator is configured to convert the common voltage, or another voltage that is dependent on the common voltage, into the supply voltage for the microcontroller.

11. The apparatus of claim 10:
wherein the first low side gate driver comprises low and high voltage stages that are galvanically isolated from each other;
wherein the first pair of low side voltage regulators comprises first and second voltage regulators;
wherein the first pair of low side supply voltages comprises first and second supply voltages;
wherein the first voltage regulator of the first pair of low side voltage regulators is configured to provide the first supply voltage of the first pair of low side supply voltages to the low voltage stage of the low side gate driver;
wherein the second voltage regulator of the first pair of low side voltage regulators is configured to provide the second supply voltage of the first pair of low side supply voltages to the high voltage stage of the low side gate driver.

12. The apparatus of claim 10:
wherein the second voltage regulator is configured to convert the common voltage into a third supply voltage;
wherein the first voltage regulator is configured to convert the third supply voltage into the first voltage for the low voltage stage.

13. The apparatus of claim 10 further comprising
a circuit for monitoring the microcontroller, the first high side gate driver and the first low side gate driver,
wherein the monitoring circuit is configured to control the first high side and low side gate drivers in response to detecting a failure of the microcontroller or in response to detecting an error in the first high side gate driver or the first low side gate driver.

14. The apparatus of claim 10 further comprising:
a second high side gate driver coupled to receive the first pair of high side supply voltages;
a second low side gate driver coupled to receive the first pair of low side supply voltages.

15. The apparatus of claim 10 further comprising:
a second high side gate driver;
a second low side gate driver;
a second pair of high side voltage regulators for providing a second pair of high side supply voltages to the second high side gate driver;
a second pair of low side voltage regulators for providing a second pair of low side supply voltages to the second low side gate driver.

16. The apparatus of claim 15 further comprising:
a first high side power switch comprising a gate terminal, a first terminal and a second terminal;
a second power switch comprising a gate terminal, a first terminal and a second terminal;

wherein the second terminal of the first high side power switch is coupled to the first terminal of the second power switch;

wherein the gate terminal of the first high side power switch is coupled to the first high side gate driver;

wherein the gate terminal of the second power switch is coupled to the second high side gate driver.

17. An apparatus comprising:
a first high side gate driver;
a first low side gate driver;
a microcontroller configured to control the first high side and low side gate drivers;
a voltage regulator for providing a supply voltage to the microcontroller;
a first pair of high side voltage regulators for providing a first pair of high side supply voltages to the first high side gate driver;
a first pair of low side voltage regulators for providing a first pair of low side supply voltages to the first low side gate driver;
wherein the first high side gate driver comprises low and high voltage stages that are galvanically isolated from each other;
wherein the first pair of high side voltage regulators comprises first and second voltage regulators;
wherein the first pair of high side supply voltages comprises the first and second supply voltages;
wherein the first voltage regulator is configured to provide the first supply voltage to the low voltage stage;
wherein the second voltage regulator is configured to provide the second supply voltage to the high voltage stage;
further comprising,
a first terminal for receiving a first positive battery voltage;
a second terminal for receiving a second positive battery voltage that is substantially equal to the first positive battery voltage;
first and second diodes comprising first and second anodes, respectively, and first and second cathodes, respectively;
wherein the first and second anodes are connected to the first and second terminals, respectively;
wherein the first and second cathodes are connected together to provide a common voltage that depends on the first or second positive battery voltages;
wherein the second voltage regulator is configured to convert the common voltage into the second supply voltage for the high voltage stage;
wherein the voltage regulator is configured to convert the common voltage, or another voltage that is dependent on the common voltage, into the supply voltage for the microcontroller.

* * * * *